United States Patent
Onishi et al.

(10) Patent No.: US 10,705,425 B2
(45) Date of Patent: Jul. 7, 2020

(54) PHOTOSENSITIVE RESIN COMPOSITION, PHOTOSENSITIVE, SHEET, SEMICONDUCTOR DEVICE AND METHOD FOR MANUFACTURING SEMICONDUCTOR DEVICE

(71) Applicant: TORAY INDUSTRIES, INC., Tokyo (JP)

(72) Inventors: Hiroyuki Onishi, Otsu (JP); Yuki Masuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 188 days.

(21) Appl. No.: 15/559,632

(22) PCT Filed: Feb. 29, 2016

(86) PCT No.: PCT/JP2016/056053
§ 371 (c)(1),
(2) Date: Sep. 19, 2017

(87) PCT Pub. No.: WO2016/158150
PCT Pub. Date: Oct. 6, 2016

(65) Prior Publication Data
US 2018/0342386 A1 Nov. 29, 2018

(30) Foreign Application Priority Data
Mar. 27, 2015 (JP) ................. 2015-066010

(51) Int. Cl.
| G03F 7/038 | (2006.01) |
| G03F 7/40 | (2006.01) |
| C08G 65/333 | (2006.01) |
| C08G 65/331 | (2006.01) |
| G03F 7/023 | (2006.01) |
| H01L 21/02 | (2006.01) |
| H01L 21/311 | (2006.01) |
| G03F 7/022 | (2006.01) |
| H01L 21/304 | (2006.01) |
| C08L 63/00 | (2006.01) |
| C08G 59/14 | (2006.01) |
| H01L 21/027 | (2006.01) |

(52) U.S. Cl.
CPC ........... *G03F 7/0382* (2013.01); *C08G 59/14* (2013.01); *C08G 65/331* (2013.01); *C08G 65/333* (2013.01); *C08L 63/00* (2013.01); *G03F 7/022* (2013.01); *G03F 7/023* (2013.01); *G03F 7/038* (2013.01); *G03F 7/40* (2013.01); *H01L 21/0275* (2013.01); *H01L 21/02118* (2013.01); *H01L 21/02282* (2013.01); *H01L 21/304* (2013.01); *H01L 21/311* (2013.01)

(58) Field of Classification Search
CPC .............. G03F 7/038; G03F 7/30; G03F 7/40
USPC ................... 430/280.1, 270.1, 325
See application file for complete search history.

(56) References Cited

U.S. PATENT DOCUMENTS

| 2007/0134591 A1 | 6/2007 | Yamaguchi et al. |
| 2016/0320700 A1 | 11/2016 | Yokokawa et al. |

FOREIGN PATENT DOCUMENTS

| JP | 3-107160 A | 5/1991 |
| JP | 2005-234434 A | 9/2005 |
| JP | 2007-163756 A | 6/2007 |
| JP | 2010-211095 A | 9/2010 |
| JP | 2012-208360 A | 10/2012 |
| JP | 2013-254081 A | 12/2013 |
| WO | WO 2015/125514 A1 | 8/2015 |

OTHER PUBLICATIONS

International Search Report, issued in PCT/JP2016/056053, PCT/ISA/210, dated May 24, 2016.
Written Opinion of the International Searching Authority, issued in PCT/JP2016/056053, PCT/ISA/237, dated May 24, 2016.

*Primary Examiner* — John S Chu
(74) *Attorney, Agent, or Firm* — Birch, Stewart, Kolasch & Birch, LLP

(57) ABSTRACT

A photosensitive resin composition which contains a compound represented by general formula (1). (In general formula (1), $R^1$-$R^4$ may be the same or different, and each represents a hydrogen atom or an organic group having 1-4 carbon atoms; and X represents a tetravalent organic group having two or more structural units represented by general formula (2) in the main chain.) (In general formula (2), $R^5$ represents a hydrogen atom or an alkyl group having 1-20 carbon atoms, and a plurality of $R^5$s in the same molecule may be the same or different.) Provided is a photosensitive resin composition which enables the achievement of a cured film having low stress after being heated and fired, and which has excellent long-term stability, high sensitivity and high resolution.

11 Claims, No Drawings

PHOTOSENSITIVE RESIN COMPOSITION, PHOTOSENSITIVE, SHEET, SEMICONDUCTOR DEVICE AND METHOD FOR MANUFACTURING SEMICONDUCTOR DEVICE

TECHNICAL FIELD

The present invention relates to a photosensitive resin composition, a photosensitive sheet, a semiconductor device, and a method for producing a semiconductor device. Specifically, the present invention relates to: a photosensitive resin composition that contains a crosslinking compound and is used for flexible materials, for example, a photosensitive resin composition that is preferably used for surface protective films for semiconductor elements, interlayer dielectric films, insulating layers of organic electroluminescence elements, and the like; a photosensitive sheet using the photosensitive resin composition; a semiconductor device using the photosensitive resin composition; and a method for producing such a semiconductor device.

BACKGROUND ART

Heretofore, compositions formed by mixing polyimide-based and polybenzoxazole-based resins having an excellent heat resistance, electrical insulation properties, and the like together with crosslinking compounds that are generally called thermal crosslinking agents have widely been used in a surface protective film and an interlayer dielectric film of semiconductor elements, an insulating layer of organic electroluminescence elements, and a flattening film of TFT substrates. These coating films are formed and then heat-baked, thereby crosslinking the resin to afford a thin film having an excellent heat resistance and mechanical characteristics.

In recent years, however, a significant problem has been posed, for example, in that, resulting from devices being made into thinner films, the composition shrinks during heat-baking, whereby the coated substrate undergoes an increased stress, generating a significant warpage and thus hindering automatic transport in the production processes. In response to this, it is anticipated that the shrinkage of the composition will be suppressed to make the warpage of the thin film smaller, by carrying out the heat-baking of the thin film at a low temperature of approximately 250° C. although it is usually carried out at a temperature of 350° C. or more.

CITATION LIST

Patent Literature

As a resin composition that can be heat-baked at low temperature, a photosensitive resin composition in which a ring-closed polyimide, a photo acid generator, and a thermal crosslinking agent having a methylol group are used is disclosed (for example, Patent Literature 1).

In addition, a photosensitive resin composition in which a polybenzoxazole precursor having a lower elastic modulus than before that is imparted thereto by introducing an aliphatic thereinto and a photo acid generator are used is disclosed (for example, Patent Literature 2).

Further, a negative-working photosensitive composition that has: a soluble polyimide having a polyoxypropylene-diamine residue; a photopolymerizable compound; and a photopolymerization initiator, in order to achieve low stress, has been introduced (for example Patent Literature 3).

As positive-working photosensitive resin compositions, there are many of them in which an epoxy crosslinking agent containing a polyethylene oxide is used. For example, a positive-working photosensitive resin composition that contains an alkali-soluble polyimide and an epoxy crosslinking agent containing a polyethylene oxide in the main chain has been introduced (for example, Patent Literature 4). In this example, excellent characteristics such as a warpage decreased by reducing stress and a high resolution have been achieved.

Other than these, a water-soluble photosensitive resin composition containing: a multicomponent block copolymer polyimide resin that is composed of a specific diamine and an acid dianhydride and has a weight average molecular weight of 20,000 to 200,000; a photosensitizer; and water has been introduced (for example. Patent Literature 5).

Patent Literature 1: JP 4918968 B2
Patent Literature 2: JP 2008-224984 A
Patent Literature 3: JP 2011-95355 A
Patent Literature 4: JP 2012-208360 A
Patent Literature 5: JP 4438227 B2

SUMMARY OF INVENTION

Technical Problem

However, the technology of Patent Literature 1 involves a high elastic modulus and a large shrinkage during heat-baking, i.e., curing, hence failing to achieve an improvement on the warpage of a thin film.

In addition, the technology of Patent Literature 2 results in a large stress due to the impact of the film shrinkage caused by the cyclodehydration of a polybenzoxazole precursor. On that account, photosensitive resin compositions using these resins also have not improved the problem of warpage sufficiently.

The technology of Patent Literature 3 is about a negative-working photosensitive composition, which hence has a resolution insufficient for use in a protective film for semiconductor elements, and a positive-working photosensitive resin composition having a higher resolution and allowing alkaline development is demanded.

The technology of Patent Literature 4 may unfavorably cause an epoxy compound to undergo a dark reaction through the impact of a residual amine generated during the synthesis of a polyimide, posing a concern about the temporal stability.

The water-soluble photosensitive resin composition used in the technology of Patent Literature 5 has limited applications, for example, because it uses a material for making it have a low line expansion, resulting in having a low exposure sensitivity, and further includes a large amount of water, hence being unsuitable for use in surface protective films for semiconductor elements and the like, interlayer dielectric films, and insulating layers of organic electroluminescence elements.

The present invention has been made in view of problems as aforementioned, and an object thereof is to provide a photosensitive resin composition having an excellent high sensitivity, high resolution, and temporal stability. Specifically, an object of the present invention is to provide a photosensitive resin composition containing a crosslinking compound, in which the composition causes a lower stress after heat-baking and enables a cured film having a high chemical resistance to be obtained.

Solution to Problem

In order to solve the aforementioned problems, the photosensitive resin composition according to the present invention has the following constitution: in other words, a photosensitive resin composition containing a compound represented by the following general formula (1):

[Chem. 1]

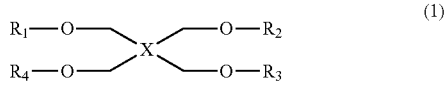

wherein, in the general formula (1), $R^1$ to $R^4$ are each a hydrogen atom or a $C_1$-$C_4$ organic group and may be the same or different; and X represents a tetravalent organic group containing, in the main chain, two or more structural units represented by the following general formula (2):

[Chem. 2]

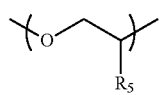

wherein, in the general formula (2), $R^5$ represents a hydrogen atom or a $C_1$-$C_{20}$ alkyl group, and a plurality of $R^5$s in the same molecule may be the same or different.

The photosensitive sheet according to the present invention has the following constitution: in other words,
a photosensitive sheet formed using the photosensitive resin composition.

The semiconductor device according to the present invention has the following constitution: in other words,
a semiconductor device having a cured film formed using the photosensitive resin composition.

The method for producing a semiconductor device according to the present invention has the following constitution: in other words,
a method for producing a semiconductor device, including the steps of: coating or laminating a substrate with the photosensitive resin composition; then carrying out an exposure step and a developing step on the substrate to form a pattern; and further heating the substrate to form a cured film.

In the photosensitive resin composition according to the present invention, a compound represented by the general formula (1) is preferably a compound represented by the following general formula (3) or (4):

[Chem. 3]

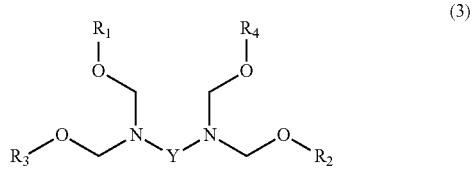

wherein, in the general formula (3), $R^1$ to $R^4$ are each a hydrogen atom or a $C_1$-$C_4$ organic group and may be the same or different; and Y represents a bivalent organic group containing, in the main chain, two or more structural units represented by the following general formula (5):

[Chem. 4]

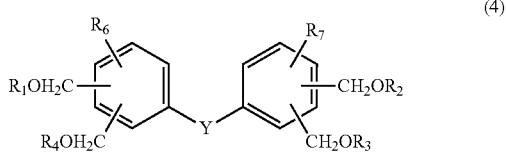

wherein, in the general formula (4), $R^1$ to $R^4$ are each a hydrogen atom or a $C_1$-$C_4$ organic group and may be the same or different; $R^6$ and $R^7$ are each a hydrogen atom or a $C_1$-$C_{20}$ organic group and may be the same or different; and Y represents a bivalent organic group containing, in the main chain, two or more structural units represented by the following general formula (5):

[Chem. 5]

wherein, in the general formula (5), $R^5$ represents a hydrogen atom or a $C_1$-$C_{20}$ alkyl group, and a plurality of $R^5$s in the same molecule may be the same or different.

The photosensitive resin composition according to the present invention preferably includes the compound represented by the general formula (1) as a crosslinking compound (A) and preferably further includes an alkali-soluble resin (B), a photo acid generator (C), and a solvent (D).

In the photosensitive resin composition according to the present invention, the alkali-soluble resin (B) is preferably a polyimide, a polybenzoxazole, a polyamideimide, a precursor of any one thereof, or a copolymer containing any one or more of them.

In the photosensitive resin composition according to the present invention, the alkali-soluble resin (B) preferably contains, in the main chain, two or more structural units represented by the following general formula (6):

[Chem. 6]

wherein, in the general formula (6), $R^5$ represents a hydrogen atom or a $C_1$-$C_{20}$ alkyl group, and a plurality of $R^5$s in the same molecule may be the same or different.

In the photosensitive resin composition according to the present invention, the structural unit of the alkali-soluble resin (B) represented by the general formula (6) is preferably derived from a diamine residue.

The photosensitive resin composition according to the present invention preferably further includes, as another crosslinking compound (A'), one or more selected from a compound having a benzoxazine structure, a compound having an epoxy structure, a compound having an oxetane structure, and a compound having an alkoxymethyl structure.

In the photosensitive resin composition according to the present invention, the mass ratio of the crosslinking compounds (A) and (A') is preferably 9:1 to 1:9 as (A):(A').

Advantageous Effects of Invention

The present invention can afford a photosensitive resin composition having an excellent temporal stability, a high sensitivity, and a high resolution, and can afford a cured film that causes a lower stress after heat-baking.

DESCRIPTION OF EMBODIMENTS

The photosensitive resin composition according to the present invention is a resin composition containing a compound represented by the general formula (1).

A compound represented by the general formula (1) contained in the resin composition according to the present invention has crosslinkability and accordingly may be referred to as "crosslinking compound (A)" hereinafter. In the general formula (1), $R^1$ to $R^4$, the same or different, are each a hydrogen atom or a $C_1$-$C_4$ organic group. Preferably, any one or more of $R^1$ to $R^4$ is a $C_1$-$C_4$ organic group, and more preferably, any one or more of $R^1$ to $R^4$ is either a methyl group or a t-butyl group. In the general formula (1), X represents a tetravalent organic group containing, in the main chain, two or more structural units represented by the general formula (2).

In the general formula (2), $R^5$ represents a hydrogen atom or a $C_1$-$C_{20}$ alkyl group, and a plurality of R's in the same molecule may be the same or different. Preferably, the plurality of $R^5$s in the same molecule are either or both of hydrogen atoms and methyl groups.

A compound represented by the general formula (1) is preferably a compound represented by the general formula (3) or (4). A compound represented by the general formula (3) can be synthesized by substituting a hydrogen atom of a diamine having a specific polyalkyleneglycol structure. As compounds that serve synthesis, JEFFAMINE KH-511. JEFFAMINE ED-600, JEFFAMINE ED-900, JEFFAMINE ED-2003, JEFFAMINE EDR-148, JEFFAMINE EDR-176, ELASTAMINE RP-409, ELASTAMINE RE-900, ELASTAMINE RE1-1000, ELASTAMINE RT-1000 (which are trade names, available from HUNTSMAN Corporation), and the like are preferable, and specific examples include, but are not limited to, a compound represented by the following general formula:

[Chem. 7]

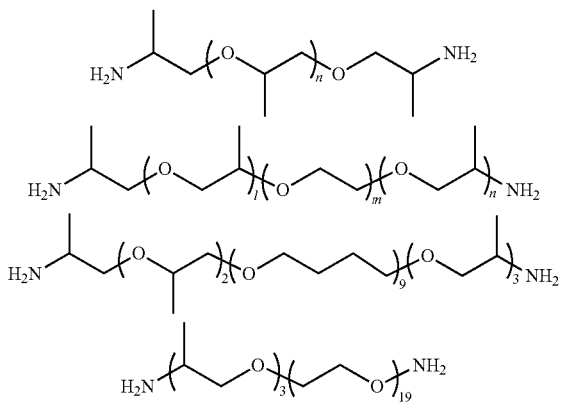

wherein n is an integer of 2 or more; and 1+m+n is an integer of 3 or more.

Many synthesis methods can be applied in order to obtain a compound represented by the general formula (4). For example, an epoxy compound having a polyalkyleneglycol structure can be used as a raw material for synthesis. As raw material compounds that serve synthesis, EPICLON EXA-4880, EPICLON EXA-4850-1000, EPICLON EXA-4822 (which are trade names, available from Dainippon Ink and Chemicals, Inc.,), RIKARESIN BEO-60E (which is a trade name, available from New Japan Chemical Co., Ltd.), and the like are preferable, and more specific examples include, but are not limited to, a compound represented by the following general formula:

[Chem. 8]

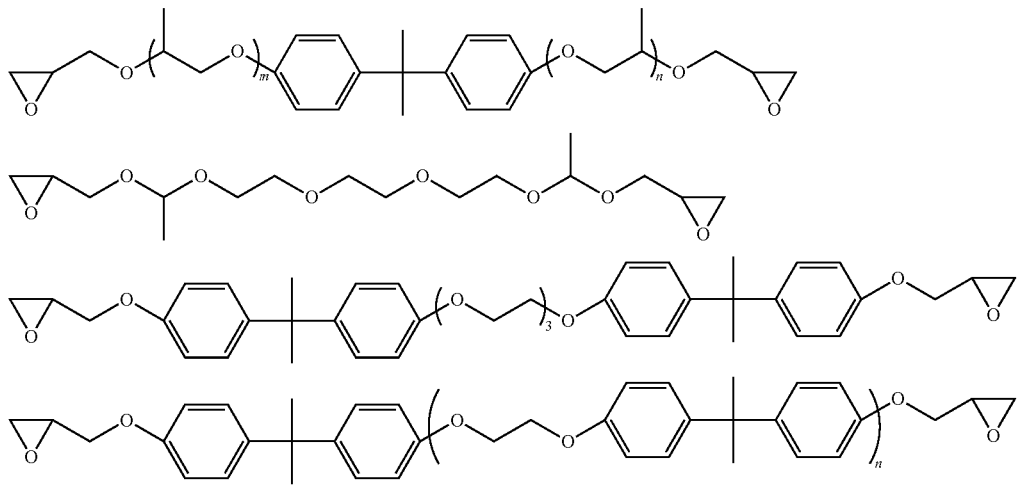

wherein m is an integer of 1 or more; and n is an integer of 2 or more.

In the photosensitive resin composition according to the present invention, another crosslinking compound (A') in addition to the compound represented by the general formula (1) is preferably used as the crosslinking compound (A) for the purpose of enhancing the chemical resistance and heat resistance of a cured film obtained after heat-baking. Examples of other crosslinking compounds (A') include a compound having a benzoxazine structure, a compound having an epoxy structure, a compound having an oxetane structure, and a compound having an alkoxymethyl structure.

Preferred examples of the compound having a benzoxazine structure include B-a type benzoxazine, B-m type benzoxazine (which are trade names, available from Shikoku Chemicals Corporation), a benzoxazine adduct of a polyhydroxystyrene resin, a phenol novolac type dihydrobenzoxazine compound, and the like.

Preferred examples of the compound having an epoxy structure include EPICLON 850-S, EPICLON HP-4032, EPICLON HP-7200, EPICLON HP-820, EPICLON HP-4700. EPICLON EXA-4710. EPICLON HP-4770, EPICLON EXA-859CRP. EPICLON EXA-4880, EPICLON EXA-4850, EPICLON EXA-4816, EPICLON EXA-4822 (which are trade names, available from Dainippon Ink and Chemicals, Inc.), RIKARESIN BPO-20E. RIKARESIN-BEO-60E (which are trade names, available from New Japan Chemical Co., Ltd.), EP-4003S, EP-4000S (which are trade names, available from ADEKA CORPORATION), and the like.

Examples of oxetane compounds include a compound having two or more oxetane rings in a molecule, 3-ethyl-3-hydroxymethyloxetane, 1,4-bis {[(3-ethyl-3-oxetanyl)methoxy]methyl}benzene, 3-ethyl-3-(2-ethylhexylmethyl)oxetane, 1,4-benzenedicarboxylic acid-bis[(3-ethyl-3-oxetanyl)methyl]ester, and the like. As a specific example, ARONE OXETANE Series manufactured by Toagosei Co., Ltd. can be suitably used.

Preferred examples of the compound having an alkoxymethyl structure include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P. TriML-35XL, TML-HQ, TML-BP, TML-pp-BPF, TML-BPE, TML-BPA, TML-BPAF, TML-BPAP, TMOM-BP. TMOM-BPE, TMOM-BPA, TMOM-BPAF, TMOM-BPAP, HML-TPPHBA, HML-TPHAP, HMOM-TPPHBA, HMOM-TPHAP (which are trade names, available from Honshu Chemical Industry Co., Ltd.), NIKALAC (registered trademark) MX-290, and NIKALAC MX-280, NIKALAC MX-270, NIKALAC MX-279, NIKALAC MW-100LM, NIKALAC MX-750LM (which are trade names, available from Sanwa Chemical Co., Ltd.).

Among these other crosslinking compounds (A'), a compound having an alkoxymethyl structure is preferably used in combination from the viewpoint of having an excellent affinity for a compound represented by the general formula (1), and a compound selected from MX-290, NIKALAC MX-280, NIKALAC MX-270, NIKALAC MX-279, NIKALAC MW-100LM, and NIKALAC MX-750LM is preferably used in combination.

The mass ratio of the crosslinking compound (A) to the other crosslinking compound (A') is preferably 9:1 to 1:9 as (A):(A'), more preferably 9:1 to 6:4 as (A):(A'). In these preferable ranges, a cured film obtained after heat-baking can cause a lower stress and have a further enhanced chemical resistance, both at once.

The content of the crosslinking compound (A) is preferably 5 to 50 parts by mass relative to 100 parts by mass of the alkali-soluble resin (B). The content of 5 parts by mass or more can enhance the chemical resistance of a cured film, and 50 parts by mass or less can reduce the shrinkage during heat-curing.

A resin used for the resin composition according to the present invention is not limited to a particular one but is preferably soluble in an alkaline aqueous solution if used for a functional resin composition having photosensitivity and developability. Examples of alkali-soluble resins (B) include novolac resins, acrylic resins, fluorene resins, and the like, and are particularly preferably polyimide resins, polybenzoxazole resins, polyamideimide resins, precursors of any one thereof, or copolymers containing any one or more of them. The use of these preferable resins can enhance the heat resistance of a cured film obtained after heat-baking. In addition, when the alkali-soluble resin (B) is a resin containing, in the main chain, two or more structural units represented by the following general formula (6), it is preferable from the viewpoint of affording a cured film that causes a lower stress after heat-baking, and the structural unit represented by the following general formula (6) is further preferably derived from a diamine from the viewpoints that the production processes are easy, stable resins are obtained even after long-term storage, and the temporal stability of the photosensitive resin composition is higher.

[Chem. 9]

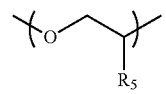

(6)

wherein $R^5$ represents a hydrogen atom or a $C_1$-$C_{20}$ alkyl group, and a plurality of $R^5$s in the same molecule may be the same or different.

Polyimide resins and polyimide precursor resins preferably used for the resin composition according to the present invention can be obtained by reacting a tetracarboxylic acid, the corresponding tetracarboxylic dianhydride, tetracarboxylic diester dichloride, or the like with a diamine, the corresponding diisocyanate compound, or trimethylsilylated diamine, and have a tetracarboxylic residue and a diamine residue. More preferable examples include a structure obtained by reacting a tetracarboxylic acid or the corresponding tetracarboxylic dianhydride with a diamine compound having an alkyleneglycol structure, and a resin obtained by the reaction contains, in the main chain, two or more structural units represented by the general formula (6). Examples of diamine compounds having an alkyleneglycol structure include JEFFAMINE KH-511, JEFFAMINE ED-600, JEFFAMINE ED-900, JEFFAMINE ED-2003, JEFFAMINE EDR-148, JEFFAMINE EDR-176, ELASTAMINE RP-409, ELASTAMINE RE-900, ELASTAMINE RE1-1000, and ELASTAMINE RT-1000 (which are trade names, available from HUNTSMAN Corporation).

Polybenzoxazole resins and polybenzoxazole precursor resins preferably used in the present invention can be obtained by reacting a bisaminophenol compound with a dicarboxylic acid, the corresponding dicarboxylic chloride, dicarboxylic active ester, or the like, and have a dicarboxylic residue and a bisaminophenol residue. More preferable examples include a structure obtained by reacting a tetracarboxylic acid or the corresponding tetracarboxylic dianhydride with a diamine compound having an alkyleneglycol structure, and a resin obtained by the reaction contains, in the main chain, two or more structural units represented by the general formula (6). In this regard, heat-treating and cyclodehydrating a polyhydroxy amide, which is one of the polybenzoxazole precursors, can afford a polybenzoxazole resin.

Polyamideimide resins preferably used for the resin composition according to the present invention can be obtained, for example, by reacting a tricarboxylic acid, the corresponding tricarboxylic anhydride, tricarboxylic halide, or the like with a diamine or a diisocyanate. More preferable examples include a structure obtained by reacting a tetracarboxylic acid or the corresponding tetracarboxylic dianhydride with a diamine compound having an alkyleneglycol structure, and a resin obtained by the reaction contains, in the main chain, two or more structural units represented by the general formula (6). Examples of diamine compounds having an alkyleneglycol structure include JEFFAMINE KH-511, JEFFAMINE ED-600, JEFFAMINE ED-900, JEFFAMINE ED-2003, JEFFAMINE EDR-148, JEFFAMINE EDR-176, ELASTAMINE RP-409, ELASTAMINE RE-900, ELASTAMINE RE1-1000, and ELASTAMINE RT-1000 (which are trade names, available from HUNTSMAN Corporation).

A polyimide, a polybenzoxazole, a polyamideimide, a precursor of any one of them, or a copolymer containing any one or more of them preferably used in the photosensitive resin composition according to the present invention is preferably any of a block copolymer, a random copolymer, an alternating copolymer, and a graft copolymer, or a combination thereof. For example, block copolymers can be obtained by reacting a polyhydroxyamide with a tetracarboxylic acid, the corresponding tetracarboxylic dianhydride, tetracarboxylic diester dichloride, or the like. The resin obtained by copolymerization further preferably contains, in the main chain, two or more structural units represented by the general formula (6).

Favorably, the resin composition according to the present invention can have photosensitivity imparted thereto by containing an acid generator (C). Examples of acid generators (C) include those with sulfonic acid of quinonediazide ester-bonded to a polyhydroxy compound, those with sulfonic acid of quinonediazide sulfoneamide-bonded to a polyamino compound, and those with sulfonic acid of quinonediazide ester-bonded and/or sulfoneamide-bonded to a polyhydroxypolyamino compound. All functional groups of these polyhydroxy compound, polyamino compound, and polyhydroxypolyamino compound are optionally not substituted with quinonediazide, but an average of 40 mol % or more of all functional groups is preferably substituted with quinonediazide. By using such a quinonediazide compound, a positive-working photosensitive resin composition which is photosensitive to i-line (wavelength of 365 nm), h-line (wavelength of 405 nm), and g-line (wavelength of 436 nm) of a mercury lamp, which are common ultraviolet rays, can be obtained.

Examples of polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-AP, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (which are trade names, available from Honshu Chemical Industry Co., Ltd.), BIR-OC, BIP-PC, BIR-PC, BIR-PTBP, BIR-PCHP, BIP-BIOC-F, 4PC. BIR-BIPC-F, TEP-BIP-A, 46DMOC, 46DMOEP, TM-BIP-A (which are trade names, available from Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, novolac resin, and the like.

Examples of polyamino compounds include, but are not limited to, 1,4-phenylenediamine, 1,3-phenylenediamine, 4,4'-diaminodiphenylether, 4,4'-diaminodiphenylmethane, 4,4'-diaminodiphenylsulfone, 4,4'-diaminodiphenyl sulfide, and the like.

Examples of polyhydroxypolyamino compounds include, but are not limited to, 2,2-bis(3-amino-4-hydroxyphenyl) hexafluoropropane, 3,3'-dihydroxybenzidine, and the like.

In the present invention, either of a quinonediazide having a 5-naphthoquinonediazide sulfonyl group and a quinonediazide having a 4-naphthoquinonediazide sulfonyl group can be used preferably. In the present invention, it is also possible to obtain a naphthoquinonediazidesulfonyl ester compound in which a 4-naphthoquinonediazidesulfonyl group and a 5-naphthoquinonediazidesulfonyl group are used in combination in the same molecule, and it is also possible to use a 4-naphthoquinonediazidesulfonyl ester compound and a 5-naphthoquinonediazidesulfonyl ester compound as a mixture.

Among these, it is more preferable that the photo acid generator (C) contain an ester compound generated by reacting a hydroxyl group of a phenol compound with a 5-naphthoquinonediazidesulfonyl group. Thus, high sensitivity can be obtained by i-line exposure.

The content of the photo acid generator (C) is preferably 1 to 50 parts by mass, more preferably 10 to 40 parts by mass, relative to 100 parts by mass of the alkali-soluble resin (B). When the content is 1 part by mass or more, photosensitivity is developed, and when it is 50 parts by mass or less, the sensitivity is higher. Furthermore, a sensitizer may be added as needed.

The photosensitive resin composition according to the present invention can contain a solvent (D). This can put the composition into a state of a varnish, thus improving coatability.

Examples of the solvent (D) include: ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane; polar aprotic solvents such as γ-butyrolactone; ketones such as acetone, methyl ethyl ketone, diisobutyl ketone, cyclohexanone, 2-heptanone, 3-heptanone, and diacetone alcohol; esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutylpropionate, ethyl acetate, n-propyl acetate, n-butyl acetate, n-pentyl formate, n-butyl propionate, ethyl butyrate, n-propyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; and amides such as N-methylpyrrolidone, N,N-dimethylformamide, and N,N-dimethylacetamide; and the like; which can be used singly or in mixture thereof, but are not limited thereto.

The amount of the solvent used is preferably 50 to 2000 parts by mass, particularly preferably 100 to 1500 parts by mass, relative to 100 parts by mass of the alkali-soluble resin (B). When the amount is 50 parts by mass or more, substrates are easily coated, and when it is 2000 parts by mass or less, cured films can be produced stably.

The photosensitive resin composition according to the present invention may contain inorganic particles, organic particles, or organic-inorganic composite particles. Preferable specific examples include, but are not limited to, silicon oxide, titanium oxide, barium titanate, alumina, talc, and the like. These particles preferably have an average primary particle diameter of 100 nm or less, more preferably 60 nm or less, in view of enhancing the smoothness and transparency of a cured film. The average primary particle diameter can be determined by the nitrogen adsorption method (BET method in accordance with JIS Z 8830 (as amended in 2013)).

In order to enhance adhesion to a substrate, the photosensitive resin composition according to the present invention may contain, as a silicon component, a silane coupling agent such as trimethoxyaminopropylsilane, trimethoxyepoxysilane, trimethoxyvinylsilane, or trimethoxythiolpropylsilane, to the extent of not losing storage stability. The preferable content of a silane coupling agent is 0.01 to 5 parts by mass relative to 100 parts by mass of the alkali-soluble resin (B). When the content is 0.01 parts by mass or more, adhesion to a substrate is developed, and when it is 5 parts by mass or less, coatability to a substrate is improved.

The photosensitive resin composition according to the present invention may contain a compound having a phenolic hydroxyl group to the extent of not reducing the shrinkage residual film rate after curing. This enables adjustment of a developing time, thus preventing the generation of scum. Examples of these compounds include Bis-Z, BisP-EZ, TekP-4HBPA, TrisP-HAP. TrisP-PA, BisOCHP-Z, BisP-MZ, BisP-PZ, BisP-IPZ, BisOCP-IPZ, BisP-CP. BisRS-2P, BisRS-3P. BisP-OCHP, methylenetris-FR-CR, BisRS-26X (which are trade names, available from Honshu Chemical Industry Co., Ltd.), BIP-PC, BIR-PTBP, BIR-BIPC-F (which are trade names, available from Asahi Organic Chemicals Industry Co., Ltd.), and the like. The photosensitive resin composition may contain two or more kinds of these.

Further, the photosensitive resin composition may have an ultraviolet absorber for preventing halation, a surfactant for preventing striation, and the like blended therein to the extent of not impairing an object of the present invention. Examples of ultraviolet absorbers include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylaminoazobenzene, 4-diethylamino-4'-ethoxyazobenzene, curcumin, and the like. Examples of surfactants include fluorochemical surfactants such as Fluorad FC-430. Fluorad FC431 (which are trade names, available from 3M Japan Limited), Eftop EF122A, Eftop EF122B, Eftop EF22C, Eftop EF126 (which are trade names, available from Tohkem Products Corporation), and the like.

Then, the photosensitive sheet according to the present invention refers to the photosensitive resin composition according to the present invention with which a support is coated, which is dried in the range of temperature and time that can volatilize a solvent, and formed into the shape of a sheet that is not completely cured, and which is soluble in an alkaline aqueous solution.

The support is not limited to a particular one, but various films that are usually commercially available such as polyethylene terephthalate (PET) films, polyphenylene sulfide films, and polyimide films can be used. A surface treatment such as with silicone, a silane coupling agent, an aluminum chelate agent, or polyurea may be provided for a joined face between the support and the photosensitive resin composition in order to enhance the adhesion and releasability. In addition, the thickness of the support is not limited to a particular value, but is preferably in the range of 10 to 100 μm from the viewpoint of workability. Further, in order to protect the surface of the photosensitive composition film obtained by coating, a protective film may be provided on the film surface. This can protect the surface of the photosensitive resin composition from pollutants such as dirt and dust in the atmosphere.

Examples of methods for coating the support with the photosensitive resin composition include methods such as spin-coating using a spinner, spray coating, roll coating, screen printing, blade coaters, die coaters, calender coaters, meniscus coaters, bar coaters, roll coaters, comma roll coaters, gravure coaters, screen coaters, and slit die coaters. In addition, the coating film thickness depends on the coating technique, the concentration of solid in the composition, the viscosity, and the like, but usually the film thickness achieved after drying is preferably 0.5 μm to 100 μm.

For drying, an oven, a hot plate, infrared ray, and the like can be used. The drying temperature and the drying time have only to be in a range in which a solvent can be volatilized, and is preferably set, as appropriate, in a range such that the photosensitive resin composition turns into the uncured or half-cured state. Specifically, it is preferably carried out in the range of 40° C. to 150° C. for one to tens of minutes. In addition, these temperatures may be combined and raised in a stepwise manner, and, for example, heat treatment may be carried out at 80° C. and 90° C., each for two minutes.

Next, the method for using the photosensitive resin composition according to the present invention will be exemplified.

First, a method for using the photosensitive resin composition varnish according to the present invention or a photosensitive sheet formed using the same to form a photosensitive resin composition coating on a substrate will be described.

In a case in which a photosensitive resin composition varnish is used, a substrate is first coated with the varnish.

Examples of coating methods include methods such as spin coating using a spinner, spray coating, roll coating, and screen printing. In addition, the coating film thickness depends on the coating technique, the concentration of solid in the resin composition, the viscosity, and the like, but usually the varnish is preferably applied such that the film thickness achieved after drying is 0.5 µm to 100 µm. Next, the substrate coated with the photosensitive resin composition varnish is dried to afford a photosensitive resin composition coating. For drying, an oven, a hot plate, infrared ray, and the like can be used. The drying temperature and the drying time have only to be in a range in which an organic solvent can be volatilized, and is preferably set, as appropriate, in a range such that the photosensitive resin composition coating turns into the uncured or half-cured state. Specifically, it is preferably carried out in the range of 50° C. to 150° C. for one minute to several hours.

On the other hand, when a photosensitive sheet is used, a protective film, if any, is released, the photosensitive sheet is opposed to a substrate, and both of them are adhered together by thermo compression bonding to afford a photosensitive resin composition coating. Thermo compression bonding can be carried out by thermal pressing, thermal laminating, thermal vacuum laminating, and the like. The temperature for adhering together is preferably 40° C. or more in view of the properties of adhesion and implantation to a substrate. In addition, the temperature for adhering together is preferably 150° C. or less in order to prevent the photosensitive sheet from being cured during adhering together and thereby deteriorating the resolution in pattern-forming in the processes of exposure and development.

In any case, examples of substrates used include, but are not limited to, silicon wafers, ceramics, gallium arsenic, organic circuit boards, inorganic circuit boards, and these substrates with components of a circuit disposed thereon. Examples of organic circuit boards include: glass-substrate copper-clad laminate sheets such as glass fabric/epoxy copper-clad laminate sheets; composite copper-clad laminate sheets such as glass nonwoven fabric/epoxy copper-clad laminate sheets; heat-resistant/thermoplastic substrates such as polyether imide resin substrates, polyether ketone resin substrates, and polysulfone resin substrates; flexible substrates such as polyester copper-clad films substrates, and polyimide copper-clad film substrates; and the like. In addition, examples of inorganic circuit boards include: ceramic substrates such as alumina substrates, aluminum nitride substrates, and silicon carbide substrates; and metallic substrates such as aluminum-based substrates and iron-based substrates. Examples of components of a circuit include: conductors containing metals such as silver, gold, and copper; resistance elements containing inorganic oxides and the like; low dielectric materials containing glass-based materials and/or resins and the like; high dielectric materials containing resins, high dielectric constant inorganic particles, and the like; insulating materials containing glass-based materials and the like; and the like.

Next, the photosensitive resin composition coating formed by the aforementioned method is irradiated with actinic rays through a mask having a desired pattern and is exposed to light. Examples of actinic rays used for light exposure include ultraviolet rays, visible rays, electron rays, X-rays, and the like, and in the present invention, ultraviolet rays such as i-line (365 nm), h-line (405 nm), and g-line (436 nm) of a mercury lamp are preferably used. In a case in which a support for the photosensitive sheet is a material transparent to these rays, light exposure may be carried out without releasing the support from the photosensitive sheet.

To form a pattern, exposed parts are removed using a developing solution after light exposure. Examples of preferable developing solutions include: a tetramethylammonium hydroxide aqueous solution; and aqueous solutions of compounds exhibiting alkalinity such as diethanolamine, diethylaminoethanol, sodium hydroxide, potassium hydroxide, sodium carbonate, potassium carbonate, triethylamine, diethyl amine, methylamine, dimethylamine, dimethylaminoethyl acetate, dimethylaminoethanol, dimethylaminoethyl methacrylate, cyclohexylamine, ethylene diamine, and hexamethylene diamine. In some cases, these alkaline aqueous solutions may contain one kind of or a combination of two or more kinds of: polar solvents such as N-methyl-2-pyrrolidone, N,N-dimethyl formamide, N,N-dimethyl acetamido, dimethyl sulfoxide, γ-butyrolactone, and dimethyl acrylamide; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like.

Development can be carried out by a method such that a coating surface is sprayed with the aforementioned developing solution, immersed in the developing solution, ultrasonicated while being immersed, or sprayed with the developing solution while the substrate is being rotated. Conditions for development such as a developing time and a developing solution temperature in a developing step have only to be conditions under which exposed parts are removed, and it is preferable that, even after exposed parts are removed, development be further carried out for micro-patterning and for removing residues between patterns.

After development, rinse treatment may be carried out with water. Here, the rinse treatment may be carried out with water to which alcohols such as ethanol and isopropyl alcohol, esters such as ethyl lactate and propylene glycol monomethyl ether acetate, or the like are added.

A process of baking treatment may be introduced before development, if the process enhances a pattern resolution during development, or if the process widens the permissible ranges of developing conditions. The temperature for this is preferably in the range of 50 to 180° C., more preferably in the range of 80 to 150° C. in particular. The time is preferably 5 seconds to several hours.

After pattern-forming, heat-drying may be carried out in the range of 70 to 150° C. from the viewpoint of reducing solvent, volatile matter, and water remaining in the photosensitive resin composition coating. The time is preferably 1 minute to several hours.

The substrate thus obtained which has a pattern-processed photosensitive resin composition coating formed thereon is made into a cured film by applying a temperature of 150° C. to 450° C. thereto. This heating treatment is carried out for 5 minutes to 10 hours while raising temperature through selected temperatures in a stepwise manner or while raising temperature continuously in a selected temperature range. By way of an example, heat treatment is carried out at 110° C. and 250° C., each for 60 minutes. Alternatively, another example is a method such that temperature is raised linearly from room temperature to 220° C. in 2 hours. For this, the heat temperature is preferably 150° C. to 300° C., more preferably 180° C. to 250° C., to suppress the increase of stress.

The film thickness of a cured film can be set to any value, and is preferably 0.5 µm to 100 µm.

Next, a semiconductor device having a cured film formed using the photosensitive resin composition according to the present invention will be described. It should be noted that semiconductor devices having various structures have been proposed recently and that the applications of the photosensitive resin composition according to the present invention are not to be limited to the undermentioned.

A cured film formed using the photosensitive resin composition according to the present invention undergoes the aforementioned processes to be thus formed, and can preferably be used as a surface protective film or interlayer dielectric film of a semiconductor element. A semiconductor device that involves a process of forming a surface protective film and an interlayer dielectric film on a semiconductor element and thereafter making the substrate thinner by grinding the rear surface of the substrate experiences a larger impact by the warpage of the substrate and hence may be significantly difficult to transport automatically, but a cured film formed using the photosensitive resin composition according to the present invention has a smaller stress value and hence can preferably be used for a semiconductor device that involves a process of grinding the substrate to a thickness of 10 µm to 100 µm. In addition, semiconductor devices as mentioned in the present invention refer to not only semiconductor elements themselves, substrates having such an element connected thereto, or semiconductor elements or substrates connected to each other but also devices in general which can function by utilizing the characteristics of a semiconductor element, and electrical optical devices, semiconductor circuit boards, and all electronic components including these are encompassed in semiconductor devices.

The present invention will be specifically described below by way of Examples, but the present invention is not limited thereto.

EXAMPLES

The present invention will be described below by way of Examples, but the present invention is not limited thereto. First, the evaluation procedures in the respective Examples and Comparative Examples will be described.

Using a photosensitive resin composition that was previously filtered through a 1 µm filter made from polytetrafluoroethylene (manufactured by Sumitomo Electric Industries. Ltd.) (hereinafter referred to as varnish), the following (1) measurement of a stress value, (2) evaluation of sensitivity, (3) evaluation of resolution, and (5) evaluation of chemical resistance were carried out on both a photosensitive resin composition coating formed using the varnish on a substrate and a photosensitive resin composition coating obtained by adhering a photosensitive sheet formed using the varnish to an opposed substrate together by thermocompression-bonding.

In the method for producing a photosensitive sheet, a PET film 38 µm in thickness was coated with the photosensitive resin composition varnish using a comma roll coater, the varnish was dried at 75° C. for 6 minutes, and the coated film was laminated with a PP film 10 µm in thickness as a protective film, to afford a layered product of the PET film/photosensitive resin sheet/protective film.

(1) Measurement of Stress Value

An 8-inch (203.2 mm) silicon wafer was coated with the varnish serving each Example and Comparative Example, by a spin coating method using a coating/developing device ACT-8 (manufactured by Tokyo Electron Limited), and then the coating was baked in a hot plate (SKW-636, manufactured by Dainippon Screen Manufacturing Co. Ltd.) at 120° C. for 5 minutes to produce a prebaked film having a thickness of 10 µm±1 µm. Then, the film was heated using an inert oven CLH-21CD-S (manufactured by Koyo Thermo Systems Co., Ltd.) to 250° C. at 3.5° C./minute at an oxygen concentration of 20 ppm or less, heat-treated at 250° C. for one hour, and cooled to a temperature of 50° C. or less, whereafter the coated wafer was taken out, and the cured film thereof was measured using a stress measurement system FLX2908 (manufactured by KLA-Tencor Corporation). The case where stress is 35 MPa or more was rated as poor (D), the case where stress is 30 MPa or more but less than 35 MPa was rated as good (C), the case where stress is 15 MPa or more and less than 30 MPa was rated as better (B), and the case where stress is less than 15 MPa was rated as extremely good (A).

In a case in which the photosensitive sheet was used, the protective film was released from the photosensitive sheet produced from the varnish serving each Example and Comparative Example, and the released surface was laminated onto a silicon wafer substrate using a laminating device (VTM-200M, manufactured by Takatori Corporation) under the conditions of a stage temperature of 120° C., a roll temperature of 120° C., a degree of vacuum of 150 Pa, an attaching rate of 5 mm/second, and an attaching pressure of 0.2 MPa, whereafter the PET film as a support was released to produce a prebaked film having a thickness of 10 µm+1 µm. After this, heat treatment was carried out in the same manner as aforementioned, and a stress value for the obtained cured film was measured and evaluated by the same measurement method.

(2) Evaluation of Sensitivity

An 8-inch (203.2 mm) silicon wafer was coated with the varnish serving each Example and Comparative Example, by a spin coating method using the coating/developing system ACT-8 (manufactured by Tokyo Electron Limited) and the coating was prebaked at 120° C. for 3 minutes. Using an exposure device i-line stepper NSR-2005i9C (manufactured by Nikon Corporation), exposure was performed. After the exposure, using the developing device ACT-8, development with an aqueous 2.38% by mass tetramethylammonium hydroxide solution (hereinafter referred to as TMAH, manufactured by Tama Chemicals Co., Ltd.) was repeated three times by a paddle method (an ejection time of a developing solution of 10 seconds and a paddle time of 40 seconds), followed by rinsing with pure water and further draining and drying. The minimum light exposure at which the exposed area was completely dissolved was regarded as sensitivity. The case where sensitivity is 500 mJ/cm$^2$ or more was rated as poor (C), the case where sensitivity is 300 mJ/cm$^2$ or more and less than 500 mJ/cm$^2$ was rated as good (B), and the case where sensitivity is less than 300 mJ/cm$^2$ was rated as better (A).

In a case in which the photosensitive sheet was used, the protective film was released from the photosensitive sheet produced from the varnish serving each Example and Comparative Example, and the released surface was laminated onto a silicon wafer substrate using the laminating device (VTM-200M, manufactured by Takatori Corporation) under the conditions of a stage temperature of 120° C., a roll temperature of 120° C., a degree of vacuum of 150 Pa, an attaching rate of 5 mm/second, and an attaching pressure of 0.2 MPa, whereafter the PET film as a support was released to produce a prebaked film having a thickness of 10 µm±1 µm. After this, exposure and development were carried out in the same manner as aforementioned, and sensitivity was evaluated.

(3) Evaluation of Resolution

An 8-inch (203.2 mm) silicon wafer was coated with the varnish serving each Example and Comparative Example, by a spin coating method using the coating/developing system ACT-8 (manufactured by Tokyo Electron Limited) and the coating was prebaked at 120° C. for 3 minutes. A reticle with a cut-off pattern was set in the exposure device i-line stepper NSR-2005i9C (manufactured by Nikon Corporation) and the coating was exposed at an exposure dose of 800 mJ/cm². After the exposure, using the developing device ACT-8, development with an aqueous 2.38% by mass TMAH was repeated three times by a paddle method (an ejection time of a developing solution of 10 seconds and a paddle time of 40 seconds), followed by rinsing with pure water and further draining and drying to obtain a positive-type pattern, whereafter the pattern was observed with a microscope, and the minimum dimension resolved by line-and-space was regarded as resolution. The case where resolution is 10 μm or more was rated as poor (C), the case where resolution is 5 μm or more and less than 10 μm was rated as good (B), and the case where resolution is less than 5 μm was rated as better (A).

In a case in which the photosensitive sheet was used, the protective film was released from the photosensitive sheet produced from the varnish serving each Example and Comparative Example, and the released surface was laminated onto a silicon wafer substrate using the laminating device (VTM-200M, manufactured by Takatori Corporation) under the conditions of a stage temperature of 120° C., a roll temperature of 120° C., a degree of vacuum of 150 Pa, an attaching rate of 5 mm/second, and an attaching pressure of 0.2 MPa, whereafter the PET film as a support was released to produce a prebaked film having a thickness of 10 μm 1 μm. After this, exposure and development were carried out in the same manner as aforementioned, and resolution was evaluated.

(4) Evaluation of Temporal Stability

The varnish serving each Example and Comparative Example was measured for viscosity and placed in a closed container, which was allowed to stand in a constant-temperature bath at 23° C. for two weeks. After this, the viscosity was measured again, and the rate of change was calculated. The case where the rate of change obtained from the calculation results is 20% or more was rated as unstable (D), the case where the rate of change is 10% or more and less than 20% was rated as ordinary (C), the case where the rate of change is 5% or more and less than 10% was rated as good (B), and the case where the rate of change is less than 5% was rated as better (A).

(5) Evaluation of Chemical Resistance

An 8-inch (203.2 mm) silicon wafer was coated with the varnish serving each Example and Comparative Example, by a spin coating method using the coating/developing system ACT-8 (manufactured by Tokyo Electron Limited) and then prebaked in the hot plate (SKW-636, manufactured by Dai Nippon Screen Manufacturing Co., Ltd) at 120° C. for 5 minutes to produce a prebaked film having a thickness of 10 μm±1 μm. Then, the film on the silicon wafer was heated using the inert oven CLH-21CD-S(manufactured by Koyo Thermo Systems Co., Ltd.) to 250° C. at 3.5° C./minute at an oxygen concentration of 20 ppm or less, heat-treated at 250° C. for one hour, and cooled to 50° C. or less, whereafter the silicon wafer was taken out, the film thickness was measured, and the silicon wafer was immersed in N-methylpyrrolidone for 15 minutes. After the silicon wafer was fully cleaned with pure water, the film thickness was measured again, the case where the film thickness change rate in absolute value was more than 20% was rated as poor (C), the case where the change rate is 5% or more and 20% or less was rated as good (B), and the case where the change rate is 5% or less was rated as better (A).

In a case in which the photosensitive sheet was used, the protective film was released from the photosensitive sheet produced from the varnish serving each Example and Comparative Example, and the released surface was laminated onto a silicon wafer substrate using the laminating device (VTM-200M, manufactured by Takatori Corporation) under the conditions of a stage temperature of 120° C., a roll temperature of 120° C., a degree of vacuum of 150 Pa, an attaching rate of 5 mm/second, and an attaching pressure of 0.2 MPa, whereafter the PET film as a support was released to produce a prebaked film having a thickness of 10 μm±1 μm. After this, heat treatment and immersion into N-methylpyrrolidone were carried out in the same manner as aforementioned, and the film thickness was measured and evaluated.

Synthesis Example 1: Synthesis of Crosslinking Compound (A-1)

Six grams of the compound represented by the following formula which is a diamine compound having the respective pluralities of ethylene glycol and propylene glycol structural units, among diamine compounds having a specific polyalkylene glycol structure, was allowed to react with 12 g of paraformaldehyde in a sodium hydroxide solution by a conventional method to afford a crosslinking compound (a-1). As the result of measurement by $^{13}$C-NMR, the rate of substitution with a methylol group was 100%. After this, the compound (a-1) was dissolved in 100 g of methanol, and allowed to react under reflux for 12 hours to afford a crosslinking compound (A-1) having a methoxymethyl group. The rate of substitution with a methyl group was 99%.

[Chem. 10]

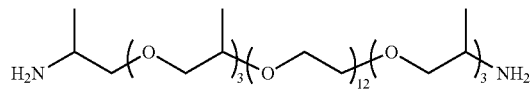

Synthesis Example 2: Synthesis of Crosslinking Compound (A-2)

Ten grams of the compound represented by the following formula which is a diamine compound having the respective pluralities of tetramethylene glycol and propylene glycol structural units, among diamine compounds having a specific polyalkylene glycol structure, was allowed to react with 12 g of paraformaldehyde in the same manner as in Synthesis Example 1 to afford a crosslinking compound (a-2). As the result of measurement by $^{13}$C-NMR, the rate of substitution with a methylol group was 100%. After this, the compound (a-2) was dissolved in 160 g of butanol, and allowed to react under reflux for 15 hours to obtain a crosslinking compound (A-2) having a butoxymethyl group. The rate of substitution with a butyl group was 68%.

[Chem. 11]

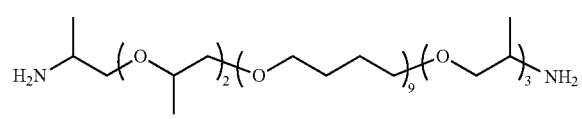

Synthesis Example 3: Synthesis of Crosslinking Compound (A-3)

5.4 grams of the compound represented by the following formula which is an epoxy compound having 6 ethylene glycol structural units, among epoxy compounds having a polyalkylene glycol structure, was brought into addition reaction with 1.8 g of paracresol by a conventional method, and allowed to further react with 21 g of paraformaldehyde in the same manner as in the aforementioned Synthesis Example 1 to afford a crosslinking compound (a-3). As the result of measurement by $^{13}$C-NMR, the rate of substitution with a methylol group was 100%. After this, the compound (a-3) was dissolved in 100 g of methanol, and allowed to react under reflux for 12 hours to afford a crosslinking compound (A-3) having a methoxymethyl group. The rate of substitution with a methylol group was 55%.

[Chem. 12]

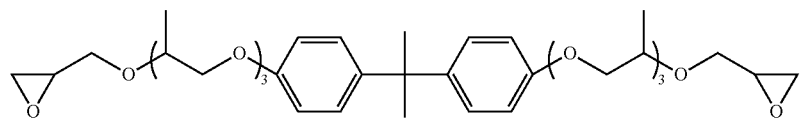

Synthesis Example 4: Synthesis of Polyimide Resin (B-1)

Under a dry nitrogen stream, 62.0 g (0.2 mol) of 3,3',4,4'-diphenylethertetracarboxylic dianhydride (hereinafter referred to as ODPA) was dissolved in 1,000 g of N-methylpyrrolidone (hereinafter referred to as NMP). To the solution, 47.5 g (0.13 mol) of 2,2-bis(3-amino-4-hydroxyphenyl)hexafluoropropane (hereinafter referred to as BAHF), 60.0 g (0.06 mol) of the compound represented by the following formula which is a diamine compound having pluralities of tetramethylene glycol and propylene glycol structural units, and 2.5 g (0.01 mol) of 1,3-bis(3-aminopropyl)tetramethyldisiloxane were added together with 250 g of NMP, followed by a reaction at 60° C. for one hour and a further reaction at 140° C. for 6 hours. After completion of the reaction, the solution was cooled to room temperature and the solution was poured into 10 L of water to afford a white precipitate. This precipitate was collected by filtration, washed three times with water, and then dried by a vacuum dryer at 80° C. for 40 hours to afford a copolymer (B-1) of polyimide as a resin of interest.

[Chem. 13]

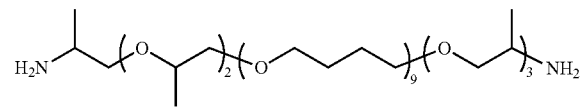

Synthesis Example 5: Synthesis of Polyimide Resin (B-2)

Under a dry nitrogen stream, 62.0 g (0.2 mol) of ODPA was dissolved in 1,000 g of NMP. To the solution, 73.1 g (0.2 mol) of BAHF was added together with 250 g of NMP, followed by a reaction at 60° C. for one hour and a further reaction at 160° C. for 6 hours. After completion of the reaction, the solution was cooled to room temperature and the solution was poured into 10 L of water to afford a white precipitate. This precipitate was collected by filtration, washed with water 3 times, dried in a vacuum dryer at 80° C. for 40 hours to afford a polyimide precursor resin (B-2).

Synthesis Example 6: Synthesis of Novolac Resin (B-3)

A mixture of m-cresol and p-cresol was made at a molar ratio of 4:6, and then brought into condensation reaction by a conventional method using an oxalic acid as an acid catalyst and using formaldehyde and salicylaldehyde as condensing agents to synthesize a novolac resin.

From the resulting novolac resin, low molecular weight fractions were removed to afford an alkali-soluble novolac resin (B-3) having a polystyrene-converted mass average molecular weight (Mw) of 7000.

Synthesis Example 7: Synthesis of Photo Acid Generator (C)

Under a dry nitrogen stream, 21.22 g (0.05 mol) of TrisP-PA (which is a trade name, manufactured by Honshu Chemical Industry Co., Ltd.) which is a polyhydroxy compound and 26.8 g (0.1 mol) of 5-naphthoquinonediazidesulfonic acid chloride (NAC-5, manufactured by Toyo Gosei Co., Ltd.) were dissolved in 450 g of 1,4-dioxane, followed by returning to room temperature. To the solution, 12.65 g of triethylamine that was mixed with 50 g 1,4-dioxane was dropwisely added in such a manner that the temperature in the system did not become 35° C. or more. After the dropwise addition, the solution was stirred at 40° C. for 2 hours. A triethylamine salt was filtered off, and the filtrate was introduced into water. Subsequently, precipitates were collected by filtration and then washed with 1% aqueous hydrochloric acid (1 L). Subsequently, the washed product was further washed with water (2 L) two times. The precipitates were dried with a vacuum dryer to afford a photo acid generator compound (C-1) represented by the following formula.

[Chem. 14]

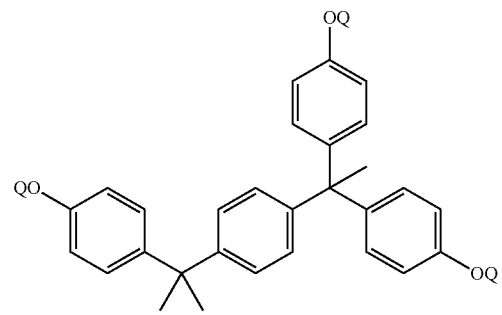

-continued

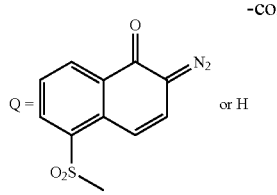

In addition, as an example of another crosslinking compound, "NIKALAC MW-100LM" (which is a trade name, available from Sanwa Chemical Co., Ltd., hereinafter referred to as A'-1) which is a compound having an alkoxymethyl structure was used. The chemical formula of this compound is shown below.

[Chem. 15]

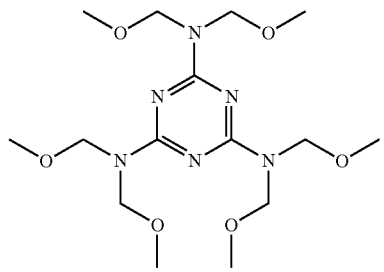

In addition, as another example of another crosslinking compound. "ARONE OXETANE OXT-221" (which is a trade name, available from Toagosei Co., Ltd.: hereinafter referred to as A'-2) which is a compound having an oxetane structure was used. The chemical formula of this compound is shown below.

[Chem. 16]

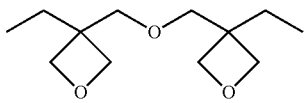

Examples 1 to 7, Comparative Examples 1 to 5

The varnishes were prepared at the mass ratios shown in Table 1, and the characteristics of these were measured by the aforementioned evaluation procedures. The results obtained are shown in Table 2.

TABLE 1

| | Component A: Crosslinking Compound (added amount) | | Component B: Alkali-soluble Resin (added amount) | |
|---|---|---|---|---|
| Example 1 | A-1 (15 parts by mass) | A'-1 (5 parts by mass) | B-1 (100 parts by mass) | — |
| Example 2 | A-2 (15 parts by mass) | A'-1 (5 parts by mass) | B-1 (100 parts by mass) | — |
| Example 3 | A-3 (30 parts by mass) | A'-1 (5 parts by mass) | B-1 (100 parts by mass) | — |
| Example 4 | A-3 (20 parts by mass) | A'-1 (5 parts by mass) | B-1 (50 parts by mass) | B-3 (50 parts by mass) |
| Example 5 | A-3 (25 parts by mass) | — | B-1 (100 parts by mass) | — |
| Example 6 | A-3 (25 parts by mass) | — | B-2 (100 parts by mass) | — |
| Example 7 | A-3 (25 parts by mass) | A'-1 (5 parts by mass) | B-3 (100 parts by mass) | — |
| Example 8 | A-3 (15 parts by mass) | A'-2 (15 parts by mass) | B-1 (100 parts by mass) | — |
| Example 9 | A-3 (5 parts by mass) | A'-2 (15 parts by mass) | B-1 (50 parts by mass) | B-3 (50 parts by mass) |
| Example 10 | A-1 (15 parts by mass) | A'-1 (5 parts by mass) | B-1 (100 parts by mass) | — |
| Example 11 | A-3 (20 parts by mass) | A'-1 (5 parts by mass) | B-1 (50 parts by mass) | B-3 (50 parts by mass) |
| Example 12 | A-3 (25 parts by mass) | — | B-2 (100 parts by mass) | — |
| Comparative Example 1 | a-1 (15 parts by mass) | — | B-1 (100 parts by mass) | — |
| Comparative Example 2 | a-2 (15 parts by mass) | — | B-1 (100 parts by mass) | — |
| Comparative Example 3 | a-3 (15 parts by mass) | — | B-1 (100 parts by mass) | — |
| Comparative Example 4 | A'-1 (15 parts by mass) | — | B-2 (100 parts by mass) | — |
| Comparative Example 5 | — | — | B-2 (100 parts by mass) | — |
| Comparative Example 6 | A'-1 (15 parts by mass) | — | B-2 (100 parts by mass) | — |

TABLE 1-continued

|  | Component C: Photo Acid Generator (added amount) | Component D: Solvent (added amount) | Form of Photosensitive Resin Composition |
| --- | --- | --- | --- |
| Example 1 | C (15 parts by mass) | γ-buthyrolactone (135 parts by mass) | Varnish |
| Example 2 | C (15 parts by mass) | γ-buthyrolactone (135 parts by mass) | Varnish |
| Example 3 | C (15 parts by mass) | γ-buthyrolactone (150 parts by mass) | Varnish |
| Example 4 | C (15 parts by mass) | γ-buthyrolactone (140 parts by mass) | Varnish |
| Example 5 | C (15 parts by mass) | γ-buthyrolactone (140 parts by mass) | Varnish |
| Example 6 | C (15 parts by mass) | γ-buthyrolactone (140 parts by mass) | Varnish |
| Example 7 | C (15 parts by mass) | γ-buthyrolactone (145 parts by mass) | Varnish |
| Example 8 | C (15 parts by mass) | γ-buthyrolactone (145 parts by mass) | Varnish |
| Example 9 | C (20 parts by mass) | γ-buthyrolactone (135 parts by mass) | Varnish |
| Example 10 | C (15 parts by mass) | γ-buthyrolactone (135 parts by mass) | Photosensitive sheet |
| Example 11 | C (15 parts by mass) | Ethyl lactate (140 parts by mass) | Photosensitive sheet |
| Example 12 | C (15 parts by mass) | Ethyl lactate (140 parts by mass) | Photosensitive sheet |
| Comparative Example 1 | C (15 parts by mass) | γ-buthyrolactone (130 parts by mass) | Varnish |
| Comparative Example 2 | C (15 parts by mass) | γ-buthyrolactone (130 parts by mass) | Varnish |
| Comparative Example 3 | C (15 parts by mass) | γ-buthyrolactone (130 parts by mass) | Varnish |
| Comparative Example 4 | C (15 parts by mass) | γ-buthyrolactone (130 parts by mass) | Varnish |
| Comparative Example 5 | C (15 parts by mass) | γ-buthyrolactone (115 parts by mass) | Varnish |
| Comparative Example 6 | C (15 parts by mass) | γ-buthyrolactone (130 parts by mass) | Photosensitive sheet |

TABLE 2

|  | Evaluation of Stress Value | | Evaluation of Sensitivity | | Evaluation of Resolution | | Evaluation of Temporal Stability | | Evaluation of Chemical Resistance | |
| --- | --- | --- | --- | --- | --- | --- | --- | --- | --- | --- |
|  | Stress Value (MPA) | Evaluation | Minimum Light Exposure (mJ/cm$^2$) | Evaluation | Minimum Dimension (μm) | Evaluation | Rate of Viscosity Change (%) | Evaluation | Film Thickness Change Rate (%) | Evaluation |
| Example 1 | 14 | A | 270 | A | 4 | A | 4 | A | 1 | A |
| Example 2 | 14 | A | 250 | A | 4 | A | 3 | A | 0 | A |
| Example 3 | 15 | B | 200 | A | 3 | A | 3 | A | 0 | A |
| Example 4 | 13 | A | 150 | A | 3 | A | 4 | A | 2 | A |
| Example 5 | 9 | A | 190 | A | 4 | A | 0 | A | 8 | B |
| Example 6 | 16 | B | 400 | B | 5 | B | 1 | A | 6 | B |
| Example 7 | 13 | A | 100 | A | 2 | A | 6 | B | 8 | B |
| Example 8 | 14 | A | 250 | A | 3 | A | 2 | A | 1 | A |
| Example 9 | 22 | B | 160 | A | 4 | A | 8 | B | 0 | A |
| Example 10 | 14 | A | 270 | A | 4 | A | — | — | 1 | A |
| Example 11 | 12 | A | 200 | A | 4 | A | — | — | 2 | A |
| Example 12 | 16 | B | 400 | B | 5 | B | — | — | 6 | B |
| Comparative Example 1 | 11 | A | 220 | A | 4 | A | 24 | D | 24 | C |
| Comparative Example 2 | 10 | A | 210 | A | 4 | A | 18 | C | 55 | C |
| Comparative Example 3 | 14 | A | 250 | A | 4 | A | 30 | D | 9 | B |
| Comparative Example 4 | 35 | D | 460 | B | 9 | B | 4 | A | 2 | A |
| Comparative Example 5 | 31 | C | 600 | C | 11 | C | 3 | A | 80 | C |
| Comparative Example 6 | 35 | D | 460 | B | 9 | B | — | — | 2 | A |

INDUSTRIAL APPLICABILITY

The present invention can afford a photosensitive resin composition having an excellent temporal stability, a high sensitivity, and a high resolution and can afford a cured film causing a low stress after heat-baking, because of which the film can preferably be used for surface protective films for semiconductor elements, interlayer dielectric films, insulating layers of organic electroluminescence elements, and the like. Examples of substrates including such semiconductor elements include silicon wafers, ceramics, gallium arsenic, organic circuit boards, inorganic circuit boards, these substrates with components of a circuit disposed thereon, and the like. Specific examples of organic circuit boards include: glass-substrate copper-clad laminate sheets such as glass fabric/epoxy copper-clad laminate sheets; composite copper-clad laminate sheets such as glass nonwoven fabric/epoxy copper-clad laminate sheets; heat-resistant/thermoplastic substrates such as polyether imide resin substrates, polyether ketone resin substrates, and polysulfone resin substrates; flexible substrates such as polyester copper-clad films substrates and polyimide copper-clad film substrates;

and the like. In addition, specific examples of inorganic circuit boards include: ceramic substrates such as alumina substrates, aluminum nitride substrates, and silicon carbide substrates; and metallic substrates such as aluminum-based substrates and iron-based substrates.

The invention claimed is:

1. A photosensitive resin composition comprising;
   a crosslinking compound (A),
   an alkali-soluble resin (b),
   a photo acid generator (C), and
   a solvent (D),
   wherein the crosslinking compound (A) is a compound represented by the following general formula (1):

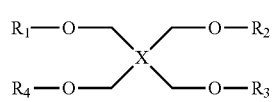
(1)

wherein, in the general formula (1),
   $R_1$ to $R_4$ are each a hydrogen atom or a $C_1$-$C_4$ organic group and may be the same or different; and
   X represents a tetravalent organic group containing, in the main chain, two or more structural units represented by the following general formula (2):

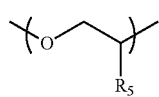
(2)

wherein, in the general formula (2),
   $R_5$ represents a hydrogen atom or a $C_1$-$C_{20}$ alkyl group, and
   a plurality of $R_5$s in the same molecule may be the same or different.

2. The photosensitive resin composition according to claim 1, wherein the compound represented by the general formula (1) is a compound represented by the following general formula (3) or (4):

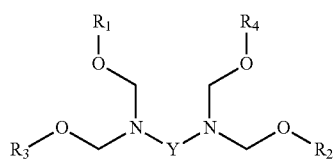
(3)

wherein, in the general formula (3),
   $R_1$ to $R_4$ are each a hydrogen atom or a $C_1$-$C_4$ organic group and may be the same or different; and
   Y represents a bivalent organic group containing, in the main chain, two or more structural units represented by the following general formula (5):

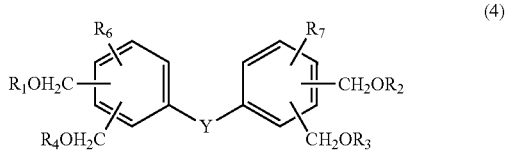
(4)

wherein, in the general formula (4),
   $R_1$ to $R_4$ are each a hydrogen atom or a $C_1$-$C_4$ organic group and may be the same or different;
   $R_6$ and $R_7$ are each a hydrogen atom or a $C_1$-$C_{20}$ organic group and may be the same or different; and
   Y represents a bivalent organic group containing, in the main chain, two or more structural units represented by the following general formula (5):

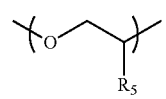
(5)

wherein, in the general formula (5),
   $R_5$ represents a hydrogen atom or a $C_1$-$C_{20}$ alkyl group, and
   a plurality of $R_5$s in the same molecule may be the same or different.

3. The photosensitive resin composition according to claim 1, wherein the alkali-soluble resin (B) is a polyimide, a polybenzoxazole, a polyamideimide, a precursor of any one thereof, or a copolymer containing one or more of them.

4. The photosensitive resin composition according to claim 1, wherein the alkali-soluble resin (B) contains, in the main chain, two or more structural units represented by the following general formula (6):

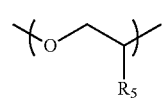
(6)

wherein, in the general formula (6), $R_5$ represents a hydrogen atom or a $C_1$-$C_{20}$ alkyl group, and a plurality of $R^5$s in the same molecule may be the same or different.

5. The photosensitive resin composition according to claim 4, wherein the structural unit of the alkali-soluble resin (B) represented by the general formula (6) is derived from a diamine residue.

6. The photosensitive resin composition according to claim 1, further comprising, as another crosslinking compound (A'), one or more selected from a compound having a benzoxazine structure, a compound having an epoxy structure, a compound having an oxetane structure, and a compound having an alkoxymethyl structure.

7. The photosensitive resin composition according to claim 6, wherein the mass ratio of the crosslinking compounds (A) and (A') is 9:1 to 1:9 as (A):(A').

8. A photosensitive sheet consisting of the photosensitive resin composition according to claim 1.

9. A semiconductor device comprising a cured film formed using the photosensitive resin composition according to claim 1.

10. A method for producing a semiconductor device, comprising the steps of:
  coating or laminating a substrate with the photosensitive resin composition according to claim 1;
  then carrying out an exposure step and a developing step on the substrate to form a pattern; and
  further heating the substrate to form a cured film.

11. A method for producing a semiconductor device, comprising the step of grinding a substrate having a cured film of the photosensitive resin composition according to claim 1 formed thereon to a thickness of 10 μm to 100 μm.

* * * * *